United States Patent [19]
Nakamura et al.

[11] Patent Number: 4,860,086
[45] Date of Patent: Aug. 22, 1989

[54] SEMICONDUCTOR DEVICE

[75] Inventors: Tohru Nakamura, Houya; Masahiko Ogirima, Tokyo; Kazuo Nakazato, Kokubunji; Takao Miyazaki, Hachioji; Naoki Yamamoto, Kawaguchi; Minoru Nagata, Kodaira, all of Japan; Shojiro Sugaki, deceased, late of Nishinomiya, Japan, by Rieko Sugaki, administrator

[73] Assignee: Hitachi, Ltd., Tokyo, Japan

[21] Appl. No.: 26,254

[22] Filed: Mar. 16, 1987

Related U.S. Application Data

[63] Continuation-in-part of Ser. No. 527,846, Aug. 30, 1983, abandoned.

[51] Int. Cl.$^4$ ............... H01L 25/54; H01L 21/72; H01L 21/76
[52] U.S. Cl. .................. 357/67; 357/71; 357/59
[58] Field of Search .......... 357/59, 67, 71, 92, 357/50, 56

[56] References Cited

U.S. PATENT DOCUMENTS

| | | | |
|---|---|---|---|
| 4,338,622 | 7/1982 | Feth et al. | 357/92 |
| 4,392,150 | 7/1983 | Courreges | 357/67 |
| 4,554,572 | 11/1985 | Chatterjee | 357/42 |

FOREIGN PATENT DOCUMENTS

56-1556  1/1981  Japan ..................... 357/59

OTHER PUBLICATIONS

Tang et al, "A Symmetrical Bipolar Structure"; IEEE, 1980, CH1616, pp. 58-60.

Primary Examiner—Andrew J. James
Assistant Examiner—S. V. Clark
Attorney, Agent, or Firm—Antonelli, Terry & Wands

[57] ABSTRACT

A semiconductor device is constructed so that an insulation film is provided in regions other than a protruding portion of a substrate. A polycrystalline silicon layer and a metal silicide layer are formed over said insulation film to provide a multi-layer structure, and a take-out portion for at least one of the emitter, base, and collector members of a bipolar transistor provided in the mesa region is constituted by a film of this multi-layer structure. By virtue of the use of metal silicide together with the polycrystalline silicon, a very low resistance is achieved which enhances the device's operating speed. Further, the metal silicide is separated from the protruding portion of the substrate by a portion of the polycrystalline silicon to provide a smooth interface with the substrate. This smooth interface significantly reduces crystal defects in the single crystal substrate.

12 Claims, 8 Drawing Sheets

WITH POLY-Si LAYER

WITH POLY-Si LAYER

WITHOUT POLY-Si LAYER

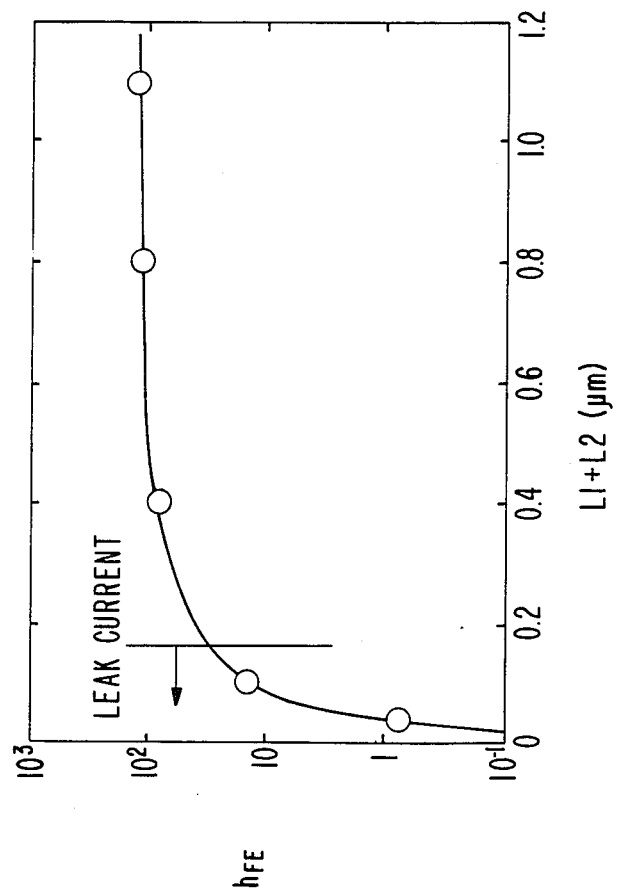

SEMICONDUCTOR DEVICE

CROSS REFERENCE TO RELATED APPLICATIONS

The present application is a continuation-in-part of application Ser. No. 527,846, filed Aug. 30, 1983 and now abandoned.

BACKGROUND OF THE INVENTION

This invention relates to a semiconductor device, and more particularly to a semiconductor device including a bipolar transistor.

The switching speed and power dissipation of a semiconductor device, which are the basic standards for indicating its performance, are determined by the value of the current in the transistor employed therein, and by the electrostatic capacitance of the elements, including parasitic elements, whose charge and discharge must be made with this current. It is desirable that the value of this capacitance be as small as possible, because the power required to operate the transistor is proportional to the capacitance for a given current. In addition, the capacitance must be reduced in order to increase the switching speed of the transistor, because the RC time constant of the transistor is proportional to the capacitance for a given sheet resistance.

Some of the present inventors have developed a semiconductor device including a bipolar transistor, etc., whose power dissipation is small, which operates at a high speed, and wherein the elements occupy a small area, by isolating the active region, etc., of the semiconductor from the substrate thereof by an insulation film, thereby reducing a parasitic capacitance, and they have already filed a patent application therefor (Japanese Patent Laid-Open No. 56-1556 and U.S. patent application No. 158,366).

FIG. 1 is a section through the structure of one example of this semiconductor device. The following is a description thereof, and it is to be noted that the material of each part and the conductivity types of the semiconductor layers are prescribed (the first conductivity type is taken to be n-type and the second conductivity type to be p-type) therein so as to simplify the explanation. This also applies to the description of the present invention which follows later. Needless to say, the invention is not limited to the materials and conductivity types used for explanation purposes.

In FIG. 1, numeral 1 denotes an Si substrate of p-type conductivity, 2 a buried layer of n+-type conductivity, and 3, 4 ($4_{-1}$, $4_{-2}$, $4_{-3}$ and $4_{-4}$) and 5 epitaxially-grown Si layers of which 3 is an n-type conductivity region, 4 a p-type conductivity region, and 5 an n+-type conductivity region. Each of these regions is formed by the doping of impurities. Numeral 6 denotes an insulation film, 7 a polycrystalline semiconductor layer, 8 an insulation film, and 9 an electrode. Numeral (I) denotes a lateral bipolar transistor wherein the electrodes of emitter and collector regions ($4_{-1}$ and $4_{-2}$) are taken out through the polycrystalline semiconductor layer 7 between the insulation films 6 and 8. Numeral (II) denotes a vertical bipolar transistor wherein the electrodes of base regions (an intrinsic base region $4_{-3}$ and a graft base region $4_{-4}$) are also taken out through the polycrystalline semiconductor layer 7 between the insulation films 6 and 8.

The structure of the transistors shown in FIG. 1 has the advantages that it enables high-speed operation because of their small parasitic capacitance, and that it also enables a reduction of the area of the elements. However, the resistance thereof is not reduced, since the take-out electrodes from the active region formed of a monocrystalline layer are constituted by the polycrystalline semiconductor layer 7. Accordingly, although the time constant, expressed as the product of the resistance and the capacitance, is reduced by the effect of the reduction of the parasitic capacitance, the realization of high-speed operation is hindered in a circuit wherein a number of multi-emitter structures are used, since the speed of operation is determined by the time constant of the slowest emitter. This is because the time constant of each emitter is affected by the resistance of the polycrystalline semiconductor layer.

Monocrystalline p-type conductivity regions 4 ($4_{-1}$, $4_{-2}$ and $4_{-4}$) in contact with the polycrystalline semiconductor layer 7 are formed by the diffusion of the p-type impurities from the polycrystalline semiconductor layer 7. That is, the p-type graft base region $4_{-4}$ is formed by diffusion from an unstable polycrystalline semiconductor region with a different diffusion constant, due to differences in the process conditions. This makes it difficult to control the depth of the graft base, and thus it has been difficult to manufacture an element with an emitter (n+-type region 5) of a small area.

SUMMARY OF THE INVENTION

An object of the present invention is to provide an improvement in the type of semiconductor device shown in FIG. 1.

That is, it is an object of this invention to provide a semiconductor device with a higher switching speed.

In order to achieve this object in accordance with the semiconductor device of the present invention, an extrinsic layer in contact with an active region is provided so as to reduce the resistivity. In this invention, the extrinsic layer includes a metal layer and/or a metal silicide layer.

A second object of this invention is to provide a method of producing the improved semiconductor device described above.

According to the method provided by this invention, a layer selected from a metal layer and/or a metal silicide layer is disposed on an extrinsic semiconductor layer.

BRIEF DESCRIPTION OF THE DRAWINGS

FIGS. 7 to 10 illustrate advantages of the present invention.

DESCRIPTION OF THE PREFERRED EMBODIMENTS

This invention will be described in detail hereunder with reference to the embodiments thereof.

Figure 1:
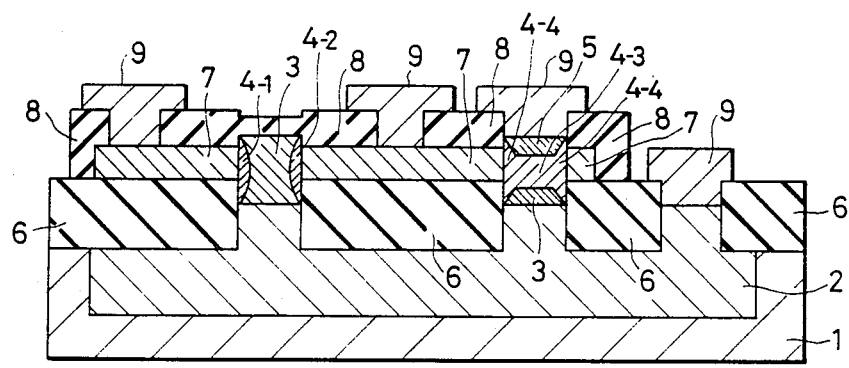
FIG. 1 is a section through the structure of one example of a semiconductor device according to U.S. patent application No. 158,366.
Figure 2:
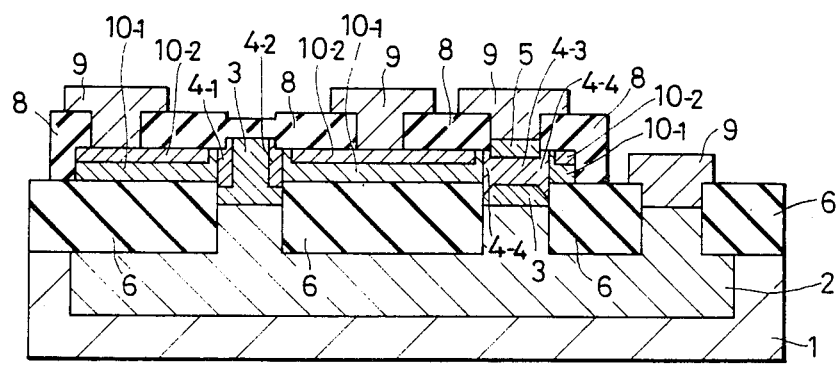
FIG. 2 is a section through the structure of a first embodiment of the present invention.

Embodiment 1:

FIG. 2 is a section through the structure of a first embodiment of the semiconductor of the present invention. In this figure, the same numbers as those used in FIG. 1 denote the same parts, or equivalent parts, as those in FIG. 1. In a bipolar transistor of the present invention, illustrated by a first embodiment thereof, electrodes 10, 10-1 and 10-2) taken out from monocrystalline regions (p-type regions 4-1 to 4-4) form a double-layer structure to reduce the resistance thereof. The electrodes 10-1 and 10-2 have a double-layer structure formed, for instance, of a polycrystalline semiconductor (a polycrystalline silicon layer) as one layer, and a metal (e.g. a refractory metal layer) or a metal silicide as the other. Electrodes 10-1 and 10-2 taken out from base regions (4-3 and 4-4) are isolated from an emitter region ($n^+$-type region 5) by an oxide film (insulation film 8), the base and emitter regions can also be formed by a self-alignment method.

The following is a description of a method of manufacturing the semiconductor device of the present invention.

FIGS. 3A to 3F illustrate the process of manufacturing the semiconductor device shown in FIG. 2. The main process steps thereof will be described hereunder in the order of figure number.

(3A): An $n^+$-type buried layer 2 is formed in a p-type Si substrate by the diffusion of impurities, an n-type Si layer 11 is grown epitaxially thereon, a silicon oxide film 12, a silicon nitride film ($Si_3N_4$) 13, and another silicon oxide film 14 are formed over the whole surface in that order, and then these three layers are removed by etching except for the parts that will form the active regions of the transistors. Next, the epitaxial layer 11 is also etched, as shown in the figure, to form mesa regions.

(3B): After the Si epitaxial layer 11 under the silicon oxide film 12 is side-etched by wet etching, an oxide film 15 is formed by thermal oxidation. A nitride film 16 and an oxide film 17 are then deposited in that order, and the oxide film 17 is etched so that it remains only in the region wherein the collector electrode of the longitudinal transistor will be formed. The nitride film 16 is then etched by reactive sputter etching so that it is left only on the side surfaces of the Si epitaxial layer 11, and in the region wherein the collector electrode will be formed.

(3C): An oxide film 6 is formed by thermal oxidation, the nitride film 16 and the oxide film 15 are removed, and p-type regions 4 are formed by the thermal diffusion of impurities.

Figure 4A:
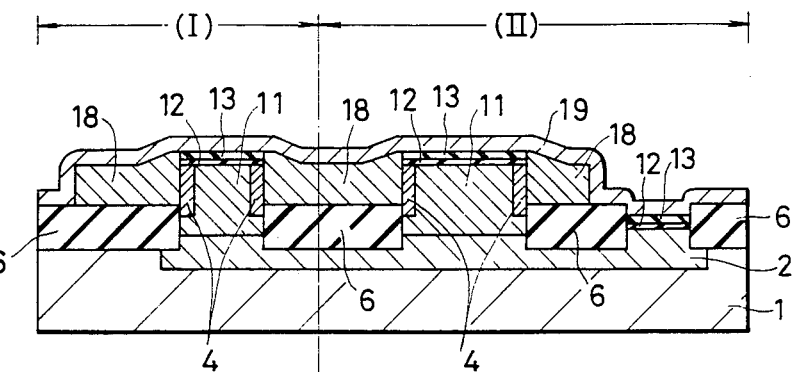
FIGS. 4A to 4D are sections through the structure of a second embodiment of the semiconductor device of the present invention, illustrating the sequence of the manufacture thereof.
Figure 4B:
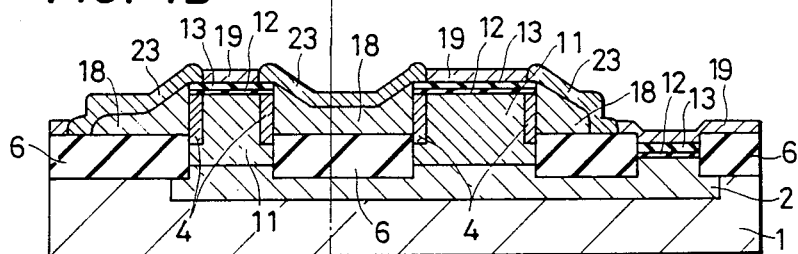
Figure 4C:
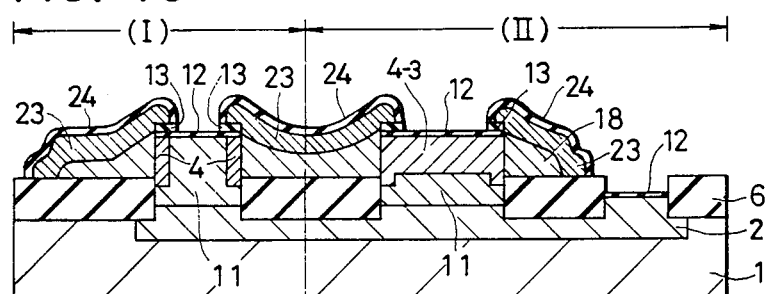

(3D): A polycrystalline silicon film 18 and a film 19 of a refractory metal or a metal silicide (e.g. molybdenum silicide, tungsten silicide, palladium silicide, nickel silicide, etc.) are deposited. When the film 19 is formed of a refractory metal, it is made into silicide together with the polycrystalline silicon film 18, and is formed into one body therewith, by a subsequent annealing process (as discussed, for example, with regard to FIG. 4B hereinafter). The polycrystalline silicon film 18 is lightly doped to be p-type. Next, a photoresist film (e.g. KTFR of Kodak Company) 20 is applied, and the areas covering the mesa regions are etched so that they are slightly broader than the mesas. A coating of a photoresist (e.g. AZ1350J of Shapley Co., Ltd.) 21 is then applied so that it penetrates the spaces between the mesa regions (the mesas of the Si epitaxial layer 11) and the photoresist film 20, and also covers their upper surfaces. Therefore, these surfaces are flat after the coating. Next, the photoresist is etched in an $O_2$ atmosphere, the etching is stopped when the metal silicide film 19 on the mesa regions is exposed. The layers of the metal silicide film 19 and the polycrystalline silicon film 18 are then removed by a plasma etching method in such a way that only the metal silicide film 19 and the polycrystalline silicon film 18 located on the top surfaces of the mesa regions are removed, so that the silicon oxide film 14 is exposed.

(3E): After the removal of the photoresists, the oxide film 14 is removed, and oxidation is used to form an insulation film 8. Next, the nitride film 13 is removed. A base region (p-type region 4-3) is formed thereafter by a method such as ion implantation.

(3F): A passivation nitride film 22 is deposited, a hole is made which will form the emitter region, and emitter impurities are added to thereby form the emitter region ($n^+$ region 5). After that, an electrode 9 for each region is formed.

The semiconductor device of the present invention for the embodiment of FIG. 2 is formed by the above process. The graft base region 4-4 in the semiconductor device of the present invention can be formed very accurately, since it is no formed by the diffusion of impurities from the polycrystalline silicon film 18. In addition, high-speed operation is enabled, since electrodes taken out from an active region formed by monocrystalline layers have a two-layer structure of a polycrystalline silicon film 18 and a metal silicide film 19 which enables a reduction of the resistance.

Figure 4D:
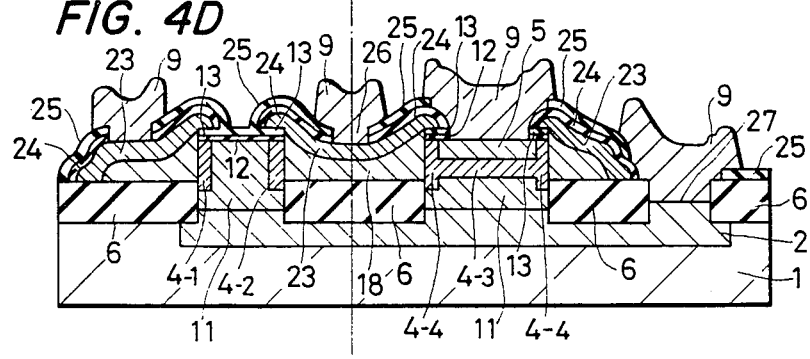

Embodiment 2:

FIGS. 4A to 4D illustrate the process of manufacturing a second embodiment of the semiconductor device of the present invention. FIG. 4D is a section through the structure of a completed semiconductor device of the present invention in accordance with this second embodiment.

Figure 3A:
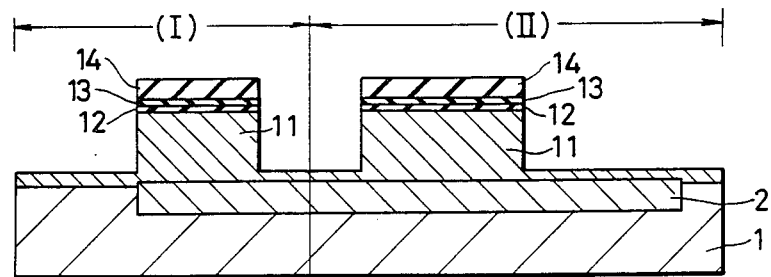
FIGS. 3A to 3F are sections through the structure of the semiconductor device of FIG. 2, illustrating the sequence of the manufacture of the device.
Figure 3B:
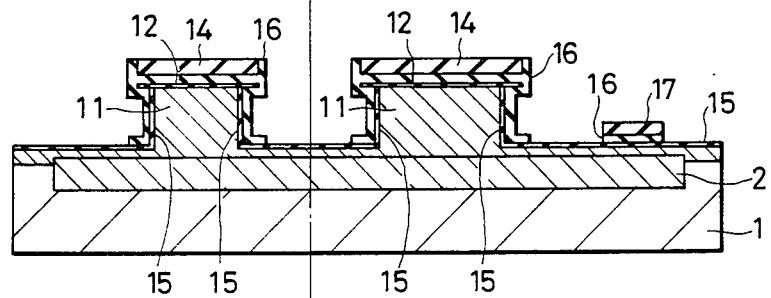
Figure 3C:
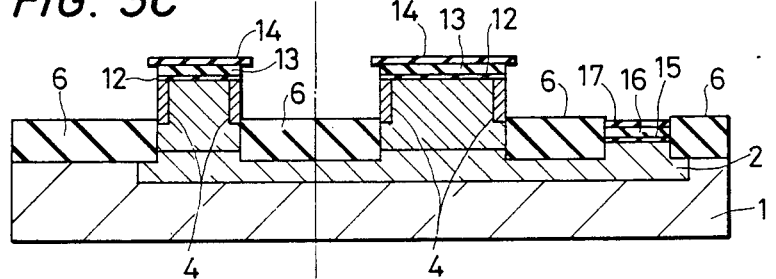
Figure 3D:
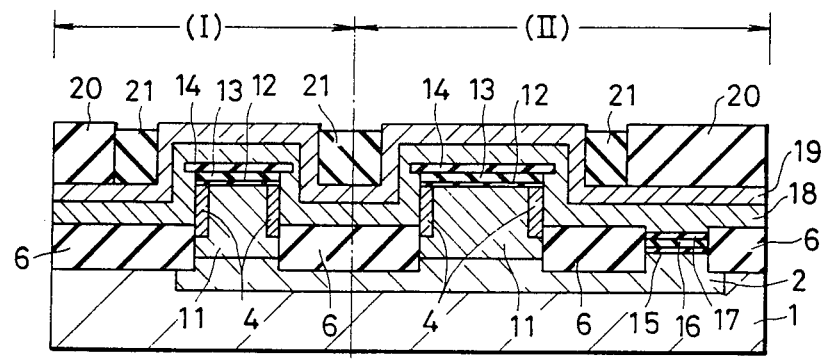

Initially, the same process steps as those for the first embodiment shown in FIGS. 3A, 3B and 3C are followed. The process then continues beginning with FIG. 4A. The following is a description of the process steps with reference to FIGS. 4A to 4D.

(4A): The polycrystalline silicon film 18 is deposited and doped slightly to be p-type. Next, only the polycrystalline silicon on the mesa regions is removed in the same way as in the first embodiment, and then the polycrystalline silicon film 18 is etched by a conventional photoetching process. After that, the oxide film 14 is etched, and then the film 19 of a refractory metal such as tungsten, molybdenum, palladium, nickel, etc., is deposited.

(4B): Tee polycrystalline silicon film 18 and the refractory metal film 19 are made to react with each other by annealing, so that a layer of metal silicide is formed only on the polycrystalline silicon film 18 and the regions around it. The annealing temperature depends upon the kind of refractory metal, the deposition method, and the annealing gas. When the refractory metal film is formed of tungsten deposited by a sputtering method and the annealing gas is hydrogen, for instance, an annealing temperature of between 600° C. to 900° C. is suitable. When the annealing temperature is less than 600° C., the reaction rate of the metal silicide is very low and when it is more than 900° C., the reaction rate of the metal silicide layer is extremely high, which results in the formation of the metal silicide layer even in regions some distance from the polycrystalline silicon film 18. This could cause short-circuits, via the metal silicide, between the parts of the pattern of the polycrystalline silicon film 18.

In this annealing process, the annealing conditions are set so that some of the metal silicide layer also grows in the peripheral regions around the polycrystalline silicon film 18. this means that a metal silicide layer 23 is formed around the periphery of the silicon nitride film 13 on the mesa regions.

(4C): The refractory metal film 19 is removed by etching (the un-reacted refractory metal film can be left as it is on the metal silicide layer 23), and an oxide film 24 is formed over the metal silicide layer 23 by an oxidation process or a deposition method. The silicon nitride film 13 is then removed by using the oxide film 24 as a mask, and the base region 4.3 is formed by a conventional ion implantation method. During this process step, the collector electrode regions of the lateral transistor region (I) and the longitudinal transistor region (II) are covered with a photoresist to prevent the implantation of ions therein.

(4D): A passivation silicon nitride film 25 is deposited, and a hole is made in the emitter region in the region 4.3. The hole in the emitter region is made so that the part of the oxide film 12 not covered with the nitride film 13 is completely exposed. For this purpose, the etched edges of the nitride film 25 are formed so as to be positioned over the oxide film 24. The emitter region (n+-type region 5) is formed thereafter by ion implantation, and the silicon nitride film 25 and the oxide films 24 and 12 are etched by a conventional photoetching process to form a base contact hole 26 and a collector contact hole 27, and electrodes 9 are then formed.

The process steps described above complete the semiconductor device of the second embodiment of the present invention. In this embodiment, the layers of the polycrystalline silicon film 18 for the base electrodes and the metal silicide film 23 (equivalent to 10 of FIG. 2) are isolated from the emitter region 5 by the oxide film 24 and the silicon nitride film 13 and thus the base electrodes and the emitter region can be formed so as to be self-aligning. Although the base electrodes are also isolated from the emitter region in a self-aligning manner in the first embodiment, they are isolated from each other in that embodiment by the oxide grown below the silicon nitride film 13. This oxide grown below the silicon nitride film is called a bird beak. Its growth depends upon the oxidation conditions, the thickness of the silicon oxide film 12, the thickness of the silicon nitride film 13, etc., and it is somewhat inferior to that in the second embodiment in terms of the control of the quantity of growth.

Figure 5:
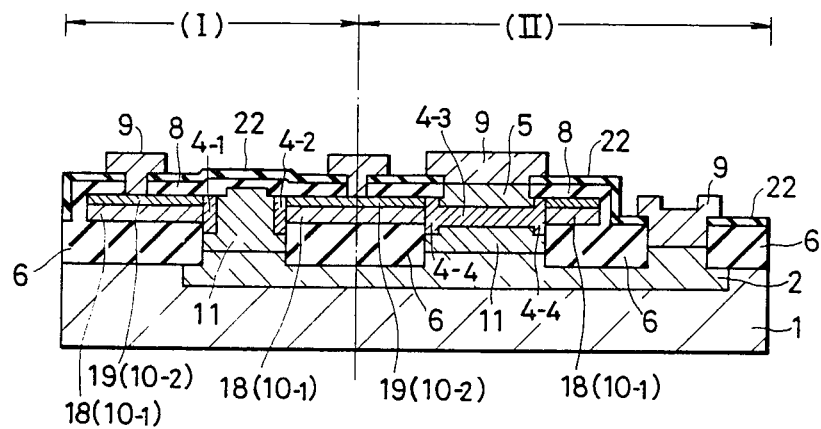
FIG. 5 is a section through the structure of a third embodiment of the semiconductor device of the present invention.

Embodiment 3:

FIG. 5 is a section through the structure of a third embodiment of the semiconductor device of the present invention.

Figure 3E:
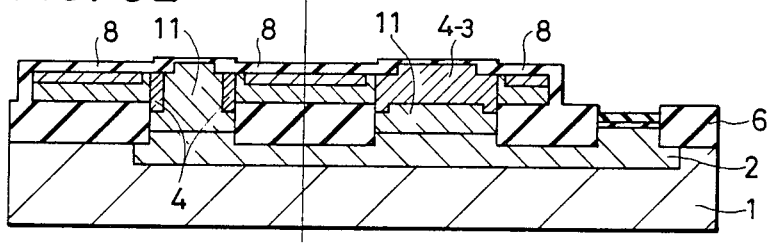

After the process steps followed in the same sequence as in the first embodiment as far as FIG. 3C, the polycrystalline silicon film 18 which is lightly doped to be p-type is deposited. Next, only the polycrystalline silicon on the mesa regions is removed in the same way as shown in the first embodiment, the metal silicide film 19 is deposited, and only the metal silicide on the mesa regions is removed. After that, the photoetching process, oxidation, etc., of FIG. 3E are applied in the same way as in the first embodiment, the emitter region 5 is then formed, and the electrodes 9 are formed. This completes the semiconductor device shown in FIG. 5.

In the present embodiment, part of the side surfaces of the monocrystalline mesa regions are in contact with the metal silicide film 19. Therefore, a lower contact resistance than that of the first embodiment can be obtained.

Figure 6:
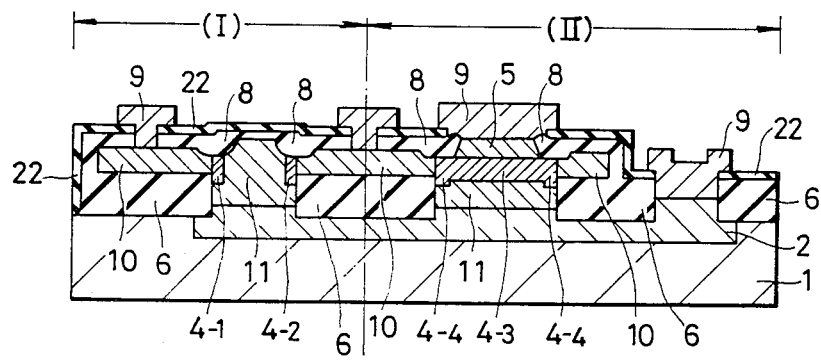
FIG. 6 is a section through the structure of a fourth embodiment of the semiconductor device of the present invention.

Embodiment 4:

FIG. 6 is a section through the structure of a fourth embodiment of the semiconductor of the present invention.

The semiconductor device of this embodiment has a higher performance than that of FIG. 5. This is because an oxide film (insulation film 8) on the metal silicide is formed thickly around the n+-type region 5 so that the p-type high-density region (4.4) and the n-type high-density region (5) are not in direct contact with each other. Therefore, the capacitance which strongly affects the high-speed operation of the elements is reduced, while the space between the emitter and the graft base is increased, and thus high-speed elements can be manufactured with an excellent yield. The figure shows the state wherein the take-out electrode 10 constituted in two layers (as in FIGS. 2, 3F and 4D) is made into one body by a subsequent annealing process, as described previously.

As described above, the present invention enables a reduction in the sheet resistance of the electrodes, which, in turn, enables the high-speed, low-power operation of the element. The following is a concrete example of the effects thereof. In a conventional semiconductor device (shown in FIG. 1), the sheet resistance of the electrodes is about 170 $\Omega/\square$, since polycrystalline silicon is used for base electrodes. On the other hand, the sheet resistance of the electrodes of the device of the present invention, using a metal silicide, is about 10$\Omega/\square$, that is a reduction of one order of magnitude from that of the conventional device. Accordingly, when a comparison is made between I$^2$L elements with four collectors, for instance, prepared both by a conventional method and by the method of the present invention, the propagation delay time ($t_{pd\ min}$) of the element of the conventional method is 2500 ps, while that of the element according to the present invention is 500 ps. This large improvement makes it possible to manufacture a PLA (Programmable Logic Array) formed of I$^2$Ls with at least four collectors, which has been impossible so far.

The effects of the present invention are not changed even when the p-type and n-type conductivities are swapped in the structure proposed by the present invention.

In addition, when a reverse-operation bipolar transistor is used as the transistor (II) (numeral 5 denotes the collector and 11 the emitter in this case) in the constitution of the semiconductor device shown in FIGS. 2, 3F, 4D, 5 and 6, the device has the structure of an I$^2$L Integrated Injection Logic) device.

Figure 3F:
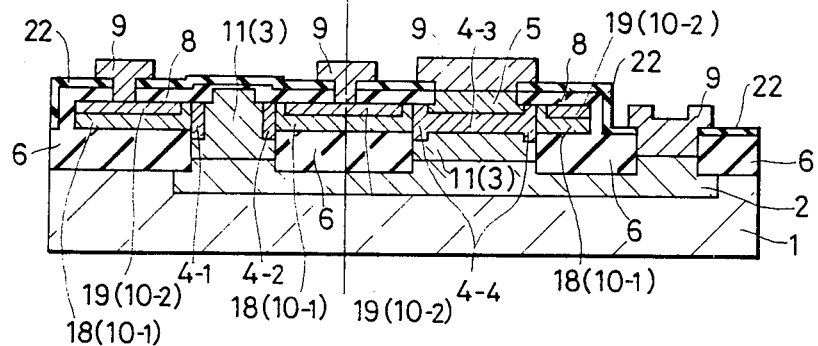

In the arrangement of FIGS. 2 and 3F, it can be seen that the polycrystalline silicon film $10_{-1}$ is formed specially to be between the metal silicide layer $10_{-2}$ and the monocrystalline regions such as $4_{-2}$ and $4_{-4}$. The significance of this will now be particularly discussed with reference to FIGS. 7 to 10.

Figure 7:
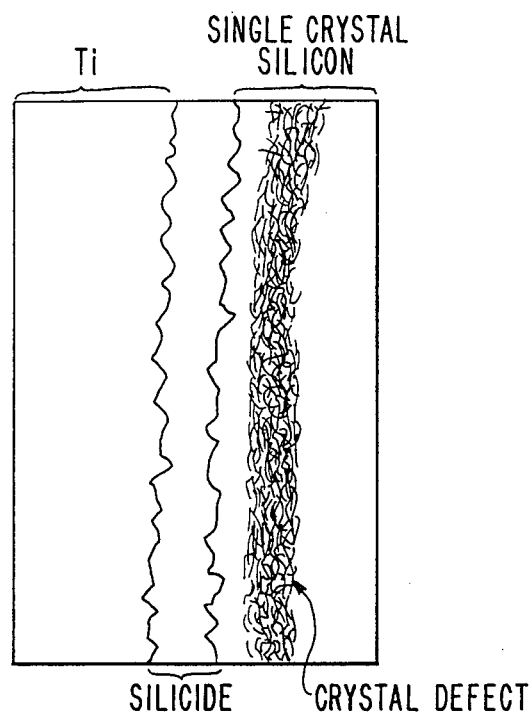

FIG. 7 shows a cross-sectional view of a titanium-silicide structure produced by silicidation of single crystal silicon substrate with titanium. The substrate was implanted by boron atoms with a dose of $1 \times 10^{16} \text{cm}^{-2}$. In the process of this silicidation, a large number of crystal defects are generated in the silicon substrate, as shown in FIG. 7. The interface between silicide and silicon substrate is not smooth, and the roughness along the interface has ridges of about 0.1 μm.

A high leakage current flows through the junction when a pn junction is formed in the defect region or near the interface region shown in FIG. 7. Therefore, it is difficult to use this silicide/single crystal silicon layer shown in FIG. 7 in conjunction with base regions with a junction depth below 0.1 μm.

Figure 8:
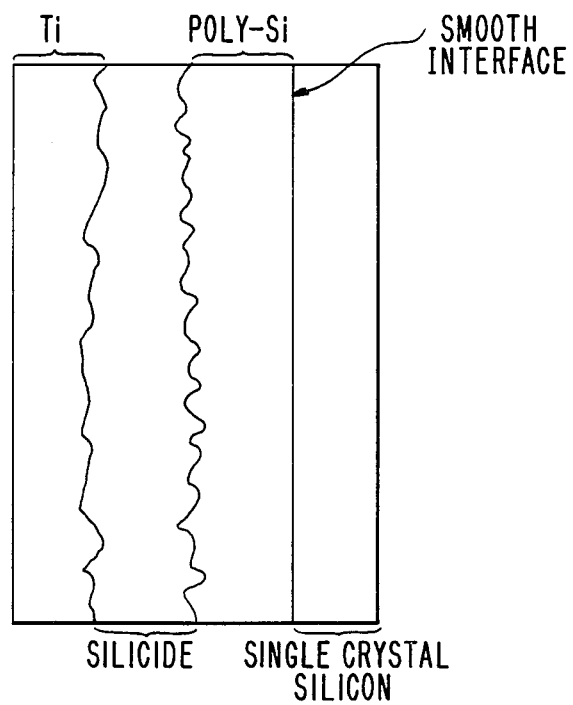

FIG. 8 is a cross-sectional view of the titanium-silicide structure produced by silicidation of polycrystalline silicon layer in accordance with the present invention. The interface between the silicide and the polycrystalline silicon layer is not smooth similar to FIG. 7. However, the other side of the polycrystalline silicon layer connected to the single crystal silicon substrate has a very smooth surface. Therefore, substantially no crystal defects are generated in the single crystal silicon substrate. Therefore, when a pn junction is formed in the single crystal silicon substrate connected to the polycrystalline silicon layer, substantially no leakage current flows. Thus, high performance bipolar devices were made.

Figure 9A:
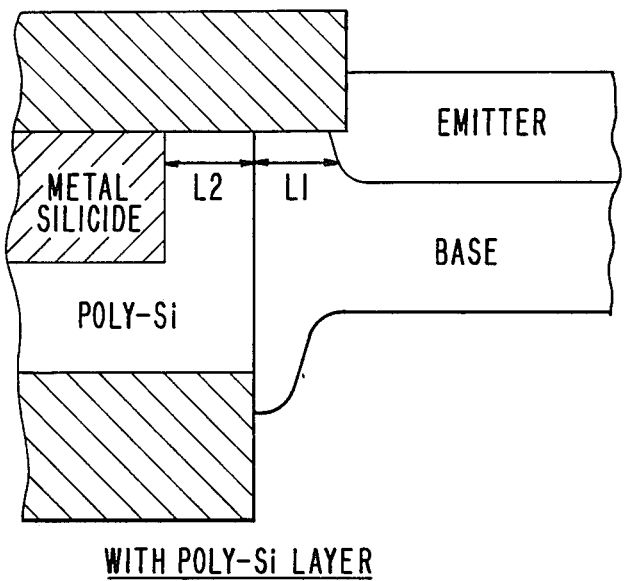

FIG. 9A shows an enlarged schematic cross-sectional view of the interface of the device shown, for example, in FIG. 2, with the polycrystalline silicon layer $10_{-1}$ between the metal silicide layer $10_{-2}$ and the single crystal silicon base region $4_{-4}$. Substantially no leakage current will flow from the emitter region to the base region using this arrangement.

Figure 9B:
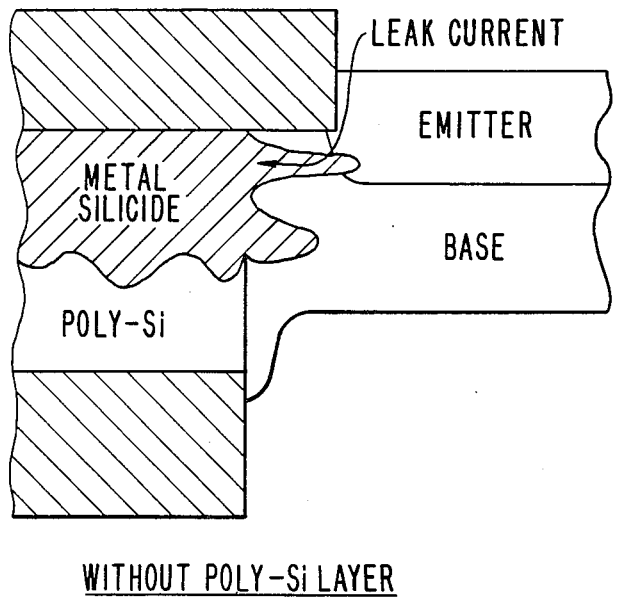

On the other hand, FIG. 9B shows the schematic cross-sectional view of a device which is formed without the polycrystalline silicon layer $10_{-1}$ formed between the metal silicide layer $10_{-2}$ and a single crystal silicon base region. In this case, a remarkable amount of crystal defects are generated in the single crystal silicon base region, and a relatively large leakage current flows.

FIG. 10 shows the current gain vs. L1+L2 dimensions shown in FIG. 9A (where L1 is the distance from the edge of the emitter to the edge of the poly-si and L2 is the distance from the edge of the metal silicide to the edge of the poly-si). As can be seen in FIG. 10, the current gain (hFE) becomes 100 when the L1+L2 is greater than 0.4 μm. However, below 0.4 μm, current gain is decreased. Leakage current begins to flow when L1+L2 goes below 0.2 μm. Therefore, to minimize undesirable leakage current it is important to provide the polycrystalline silicon layer $10_{-1}$ between the metal silicide layer $10_{-2}$ and the single crystal silicon regions. In general, L1+L2 should have a thickness of at least 0.1 μm to form high performance bipolar devices (since, as shown in FIG. 10, this can provide hFE greater than 10, which is very favorable in practical use).

The following is an explanation of the reference numerals used in the figures of the embodiments of the present invention.

```
1 ... substrate  2 ... buried layer
3 ... n-type conductivity region
4 ... p-type conductivity region
      (4₋₁ ... emitter region
       4₋₂ ... collector region
       4₋₃ ... intrinsic base region
       4₋₄ ... graft base region)
5 ... n⁺-type region (emitter region or collector region)
6 ... insulation film
7 ... polycrystalline semiconductor layer
    (polycrystalline silicon layer)
8 ... insulation film  9 ... electrode
10 ... take-out electrode
       (10₋₁ ... polycrystalline semiconductor
             (polycrystalline silicon film)
        10₋₂ ... refractory metal or metal silicide
```

We claim:

1. A bipolar transistor semiconductor device having a collector region, a base region and an emitter region comprising:
   a semiconductor body of a single crystal having a first protruding portion of a first conductivity type;
   an insulation film having a first opening, said insulation film being formed on a surface of said body so that said first protruding portion is located at said first opening;
   a first polycrystalline semiconductor layer of a second conductivity type opposite to said first conductivity type formed on said insulation layer and in contact with said protruding portion; and
   a first metal silicide layer formed on said first polycrystalline semiconductor layer and separated from said first protruding portion by a portion of said first polycrystalline semiconductor layer,
   wherein said base region is formed as a first region of said second conductivity type formed in said first protruding portion, wherein one of said emitter and said collector regions is formed as a second region of the second conductivity type formed in the first region, and wherein the other of said emitter and collector regions is formed as a third region of said first conductivity type in said semiconductor body under the first protruding portion, and further wherein said polycrystalline semiconductor layer is formed in contact with said first region forming said base region of said bipolar transistor to prevent direct contact between the base region of the bipolar transistor and the first metal silicide layer.

2. A bipolar transistor semiconductor device according to claim 1, further comprising a collector electrode coupled to said third region, a base electrode coupled to said polycrystalline semiconductor layer, and an emitter electrode coupled to said second region.

3. A bipolar transistor semiconductor device according to claim 2, wherein said insulation film has a second opening at another position on said third region, and said collector electrode is formed on said second opening.

4. A bipolar transistor semiconductor device according to claim 2, further comprising a high impurity concentration region of said first conductivity type formed in said third region, said collector electrode being formed on said high impurity concentration region.

5. A bipolar transistor semiconductor device according to claim 1, wherein said second region serves as an emitter region, said first region serves as an intrinsic base region, said first polycrystalline semiconductor layer serves as an extrinsic base region and said third region serves as a collector region to form a bipolar transistor.

6. A bipolar transistor semiconductor device according to claim 1, wherein said insulation film has a second opening, a second protruding portion of said first conductivity type is provided at said second opening, and a pair of emitter and collector regions of said second conductivity type is formed in said second protruding portion spaced from each other, to form a lateral bipolar transistor.

7. A bipolar transistor semiconductor device according to claim 6, wherein said first polycrystalline semiconductor layer couples said base region of the bipolar transistor to said collector region of the lateral bipolar transistor, and said emitter region of the bipolar transistor extends under said second protruding portion, to form an integrated injection logic device.

8. A bipolar transistor semiconductor device according to claim 7, wherein a second polycrystalline semiconductor layer of said second conductivity type is formed in contact with said emitter region of the lateral bipolar transistor on said insulation layer, and a second metal silicide layer is formed on said second polycrystalline semiconductor layer.

9. A bipolar transistor semiconductor device according to claim 7, wherein said first metal silicide layer also couples said base region of said bipolar transistor to said collector region of said lateral bipolar transistor.

10. A bipolar transistor semiconductor device comprising:
- a semiconductor body of a single crystal having a first protruding portion of a first conductivity type;
- an insulation film having a first opening, said insulation film being formed on a surface of said body so that said first protruding portion is located at said first opening;
- a base take-out electrode including a polycrystalline semiconductor layer formed on said insulation film and in electrical contact with said protruding portion; and
- a first region of said second conductivity type formed in said first protruding portion in contact with said first polycrystalline semiconductor layer formed on said insulation film,
- wherein said device further comprises a second region of said first conductivity type formed on said first region and a third region of said first conductivity type formed in said semiconductor body under said first protruding portion, said third region serving as a collector region, said first region serving as a base region and said second region serving as an emitter region to form a bipolar transistor, wherein said first region comprises a high impurity density region formed to contact said first polycrystalline semiconductor layer and a low impurity density region formed so that said high impurity density region is interposed between the low impurity density region and the first polycrystalline semiconductor layer, and wherein said device further comprises an insulating layer formed to cover said high impurity density region and to contact said second region so tat said second region is located over said low impurity density region but not over said high impurity density region, and
- wherein said base take-out electrode further comprises a metal silicide layer formed on said first polycrystalline semiconductor layer, wherein a portion of said first polycrystalline semiconductor layer separates said metal silicide layer from said first region to prevent direct contact between the base region of the bipolar transistor and the first metal silicide layer.

11. A semiconductor device according to claim 1, wherein said second region is formed in said first region in said protruding portion of said substrate to be separated from a peripheral edge of said first polycrystalline semiconductor layer, which peripheral edge is in contact with said first region, by a distance L1, wherein said first metal silicide layer is separated from said peripheral edge of said first region by a distance L2, and wherein L1+L2 is greater than or equal to 0.1 μm.

12. A bipolar transistor semiconductor device according to claim 11, wherein L1+L2 is greater than or equal to 0.2 μm.

* * * * *

UNITED STATES PATENT AND TRADEMARK OFFICE
CERTIFICATE OF CORRECTION

PATENT NO. : 4,860,086
DATED : Aug. 22, 1989
INVENTOR(S) : Nakamura et al

It is certified that error appears in the above-identified patent and that said Letters Patent is hereby corrected as shown below:

On Title page, item [30], should read

--         Foreign Application Priority Data
    Aug. 30, 1982   [JP]    Japan ............... 57-149227 --

Signed and Sealed this

Ninth Day of March, 1993

*Attest:*

STEPHEN G. KUNIN

*Attesting Officer*      *Acting Commissioner of Patents and Trademarks*